July 24, 1962 R. B. MATTHEWS 3,046,321

BURNER AND THERMOELECTRIC DEVICE ASSEMBLY

Filed Dec. 22, 1959 2 Sheets-Sheet 1

INVENTOR.
Russell B. Matthews,
BY Mason, Jackson, Brettner & Dennis Attys.

BURNER AND THERMOELECTRIC DEVICE ASSEMBLY

Filed Dec. 22, 1959 2 Sheets-Sheet 2

INVENTOR.
Russell B. Matthews,
BY Mann, Jackson
Boltton & Dienner
Attys.

United States Patent Office 3,046,321
Patented July 24, 1962

3,046,321
BURNER AND THERMOELECTRIC DEVICE ASSEMBLY

Russell B. Matthews, Milwaukee, Wis., assignor, by mesne assignments, to Penn Controls, Inc., Goshen, Ind., a corporation of Indiana
Filed Dec. 22, 1959, Ser. No. 861,398
10 Claims. (Cl. 136—4)

The present invention relates to improvements in combined burner and thermoelectric devices, and more particularly to burner and thermoelectric generators embodying thermoelectric elements characterized by being deleteriously affected by oxygen, especially at temperatures at which such generators are conventionally operated.

In recent years, thermoelectric elements of markedly improved electrical characteristics have become available and are typified by electrical conductor elements of semi-metallic alloys or compositions, as by way of example, those disclosed in United States Patents No. 2,811,570 and No. 2,811,571. Such semi-metallic thermoelectric elements, however, unlike the long known metallic thermoelectric elements, are subject to deterioration, when exposed to atmospheres containing oxygen, and if the improved electrical characteristics of such semi-metallic materials are to be retained for an appreciable useful period of time, they must be protected from oxygen. The usual and present approach in meeting the aforementioned problem is to hermetically encase the semi-metallic thermoelectric element in an enclosure containing a non-oxidizing gas, such as methane, and hermetically seal the enclosure to prevent the escape of the non-oxidizing gas and thus prevent exposure of the semi-metallic thermoelectric element to ambient atmosphere containing oxygen.

It is an important object of my invention to provide a combined burner and thermoelectric device in which the latter includes an oxidizable thermoelectric element which is protected from ambient atmospheres containing oxygen in a new and novel manner.

The aforementioned object, in certain preferred embodiments of my invention herein specifically disclosed, is achieved by providfing an assembly having passageway means for the flow of non-oxidizing combustible fluid therethrough, and an oxidizable thermoelectric element associated with the passageway means to be surrounded by an the non-oxidizable fluid and thus not exposed to ambient atmosphere containing oxygen.

A further object of my invention is to provide an assembly comprising a gas fuel burner and a thermoelectric generator adapted to have its hot junction heated by the burner, and in which the thermoelectric generator includes a semi-metallic thermoelectric element which is surrounded by a portion of the fuel gas for the burner to protect the semi-metallic thermoelectric element from surrounding ambient atmosphere.

The object last mentioned may be conveniently accomplished by providing a common body member or mounting means for the assembly in which the burner and thermoelectric generator are both mounted, although it will be understood that independent but suitably fluid connected members could be readily provided. The thermoelectric generator preferably includes an outer housing or metallic tubular encapsulating member, closed at one end and open at its other end and arranged with its open end extending into an opening in the form of a bore in the body member and with its closed end disposed in juxtaposition to the burner. Preferably the outer tubular encapsulating member serves as one thermoelectric element of the generator. A semi-metallic thermoelectric conductor, serving as a second thermoelectric element for the generator, extends inwardly of the open end of the outer tubular thermoelectric element and is connected at one end inwardly of the outer closed end of the latter to afford hot junction means for the generator. The body member is provided with suitable passageway means for conducting non-oxidizing fuel gas from a source of supply to the burner, and for connecting the bore within which the outer tubular encapsulating member of the generator is mounted, thus affording the delivery of a portion of the fuel gas to the bore of the body member within which the thermoelectric generator is mounted. Thus, the inner semi-metallic thermoelectric element is surrounded with non-oxidizing fuel gas protecting it from ambient atmosphere surrounding the body member. The source of fuel gas for the device is, of course, under pressure, and the fuel gas contained within the bore in which the generator is mounted will thus be under pressure, so that all leakage will be to the outside. In such arrangement of parts, hermetic sealing of any of the components of thermoelectric generator within the body member of the assembly is not necessary or required, thus affording a simple, efficient and highly satisfactory device obviating the disadvantage of the susceptibility of the semi-metallic thermoelectric elements to oxygen and particularly at the high temperatures to which thermoelectric generators are normally subjected.

A preferred feature of one embodiment of my invention resides in the provision of simple electrical termination for the semi-metallic thermoelectric element to resist and protect the same from oxidation before incorporation of the device in a gas supply line.

Another preferred feature of my invention is to provide flow interrupter means in the aforementioned passageway means for connecting and disconnecting the source of gas supply with the bore of the body member in which the thermoelectric generator is mounted.

A preferred feature of another embodiment of my invention is in the provision of flow interrupter means in the form of fusible material, normally solid at temperatures below predetermined conventional generator operating temperatures, in the passageway means of the body member for closing the same and capturing non-oxidizing gas in the bore in which the outer tubular encapsulating member is mounted to protect the semi-metallic element against oxidization during storage of the device.

A further preferred feature is to provide a device as last noted in which the fusible material changes from solid state to liquid state at a predetermined temperature and by such change in state contracts so as to connect the passageway means with the bore in which the generator is mounted.

A further preferred feature of my invention is the provision of an arrangement as last noted in which reservoir means is provided to receive the fusible material upon change of state from solid to liquid.

A preferred feature of another embodiment of my invention is to utilize fusible material, which at a predetermined temperature below normal operating temperature of the device, solidifies and expands to close off the connection of the gas passageway means and the bore containing the thermoelectric generator, thereby trapping gaseous fuel in the bore for protecting the semi-metallic thermoelectric element under the condition noted.

The above and other objects, features and advantages of my invention will appear from the following detail description of certain preferred embodiments of my invention.

Now in order to acquaint those skilled in the art with the manner of constructing and utilizing thermoelectric devices in accordance with the principles of my present invention, I shall describe in connection with the accompanying drawings, certain preferred embodiments of my invention.

In the drawings.

Figure 1:
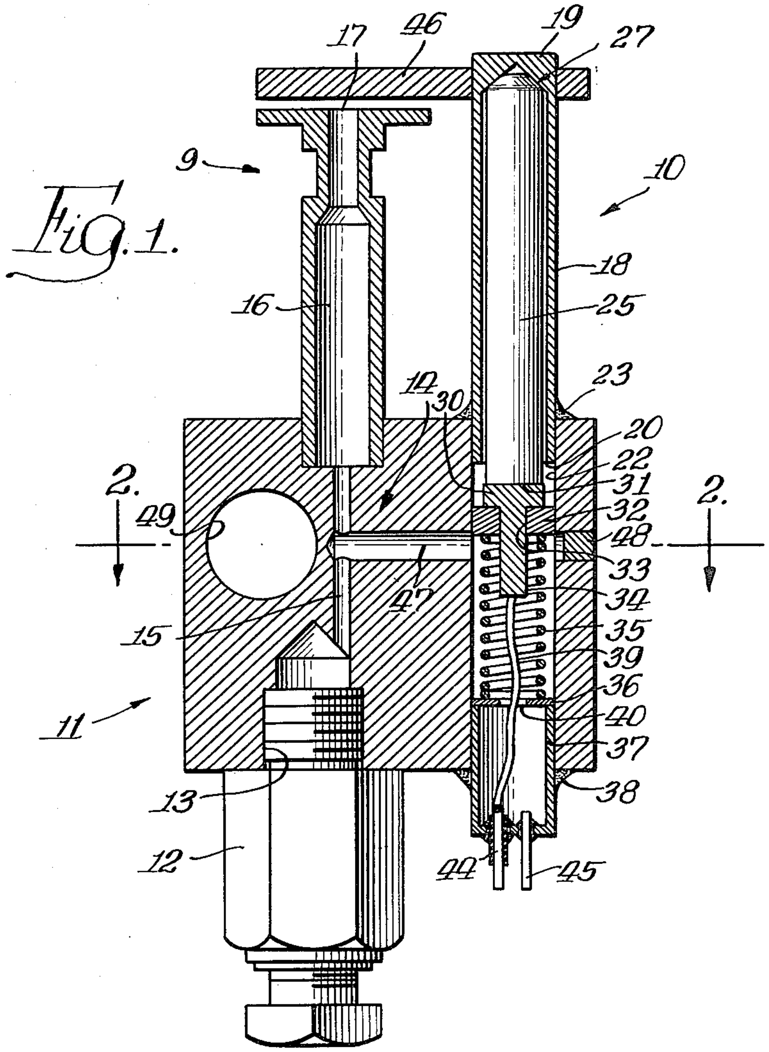
FIGURE 1 is a vertical sectional view of a burner and thermoelectric device assembly constructed in accordance with the principles of my invention.

Referring now to FIGURE 1, the burner and thermoelectric device assembly 8 of my invention there shown comprises a burner 9, which may conveniently be a gas burner serving as a pilot or main burner as desired, a thermoelectric generator, indicated generally at 10, and mounting means or body member 11 for supporting the burner 9 and thermoelectric generator 10 in juxtaposed operative relation with respect to each other.

The body member 11 has a conventional gas line connector 12 threaded therein as at 13, it being understood, of course, that the connector has suitable connection with a source of combustible fluid or gas under pressure. In the embodiment of the invention of FIGURE 1, the burner is of a character for the burning of non-oxidizing gaseous combustible fuel. The body member 11 is formed with suitable gas passageway means indicated generally at 14, which is defined by a first passageway means 15 extending from the threaded opening for the connector 12 to a passageway 16 in burner 9 for delivery of gas from the supply source for ignition at the outlet port 17 at the upper end of the burner. The thermoelectric generator 10 comprises an outer metallic housing member 18, which preferably is in the form of an elongated tubular member, closed at one end as at 19, and open at its other end as at 20. The tubular member 18 is mounted with its open end disposed inwardly of the body member 11 in an opening 22 extending through the body member. The opening 22 is preferably in the form of a bore of a diameter substantially equal to the outer diameter of the tubular member 18. The tubular member 18 may be secured and sealed to the body member 11 by silver solder about the periphery of member 18 at the edge surface of body member surrounding opening 22 as indicated at 23. As will be seen it is not essential that the seal 23 be a hermetic seal although, of course, hermetic sealing, if desired, could be employed. In the form of generator shown, the tubular member 18 is preferably of metal, such as stainless steel, and it may constitute one thermoelectric element or member of the generator. An elongated second thermoelectric element or member 25, defining a second leg of the generator is disposed to extend into the tubular housing 18, and at its outer end is in electrical contact with the adjacent inner end wall of the closed end of the outer tubular member 18 to provide a hot junction means 27 for the generator. In the above and following described embodiments of my invention, the inner thermoelectric member 25 may be fabricated of any of the now well known semi-metallic compositions disclosed, for example, in the patents aforementioned and which compositions are characterized by being deleteriously affected by oxygen, especially at the hot junction at elevated temperatures. In the instant embodiment of my invention the adjacent ends of the inner and outer thermoelectric members 18 and 25 may be welded or soldered to prevent oxidation of the inner thermoelectric member at its hot junction during storage of the device and before its incorporation in a gas line. The inner or opposite end of the inner semi-metallic thermoelectric member 25 is welded or silver soldered to a contact member 30 to afford a first cold junction means 31 for the generator. Contact 30 rests upon a supporting member 32 fitting within the bore 22 of the housing member and having a central opening 33 surrounding the downwardly projecting stem portion 34 of the contact member. A coil spring 35 seats at one end against the contact support members 2 and at the opposite end upon a plate member 36 seated at the open end of a closure cap 37 which extends into the bore 22 from the lower end thereof, and is retained in assembled position with respect to the body member 11 by silver soldering at the periphery of cap member 37 around the edge surface of body member 11 surrounding the lower end of bore 22 as at 38. The silver solder joint 38 like the silver solder joint 23 need not provide a hermetic seal, but as before, if desired, hermetic sealing may be employed. A flexible electrical lead 39 extends from the end of projection 34 of contact 32 through opening 40 in plate member 36 and extends in insulated electrical relation through a conventional lead collar 44 mounted in the closed end of the cap member 37. A second lead 45 is mounted in a cap member 37 for electrical connection therewith and forms a circuit connection for the second or outer cold junction defined by the tubular member 18 and the housing 11. The leads 44 and 45 thus afford for connecting the thermoelectric generator in circuit with a device to be controlled by the assembly of my invention.

The upper outer end of the tubular housing member 18 has suitably fixed thereto a heat conducting metal plate which extends laterally so as to be disposed over the flame issuing at the outlet port 17 of the burner 9. Upon connection of the device to a source of combustible gas under pressure, gas flow through the burner, when ignited at 17, will heat the heat conducting plate 46, and in turn, the hot junction means 27 of the generator and provide for current flow in a circuit having connection with leads 44 and 45.

The passageway means 14 further comprises a second passageway 47 connecting the first passageway 15 and bore 22 of body member 11. The contact mounting plate 32 and contact 30 do not fit tightly within the bore 22 so that gas under pressure from the source of supply is admitted through the second passageway 47 into the opening or bore 22 of the housing and tubular member 18. Thus, an atmosphere of combustible non-oxidizable gas under pressure surrounds the inner semi-metallic thermoelectric element 25 and protects or shields it from ambient atmosphere containing oxygen exteriorly of the assembly. The device as described in connection with FIGURE 1 is normally used in the open and when employing an inner thermoelectric element such as afore described it is essential, for satisfactory performance of the device, that the element be kept free from undue contact with oxygen.

The aforementioned welded or silver soldered connections at the hot junction 27 and the cold junction 30 are sufficient, at room temperatures, to protect such areas of contact of the semi-metallic element from oxidation during shelf life and before installation of the device in a gas line. Upon installation of the device in a gas line, the combustible non-oxidizing gas from the supply source will be admitted to the interior of the outer tubular housing 18, as described, and thus satisfactory performance of the assembly will result in that a portion of non-oxidizing combustible gas from the supply source surrounds and protects the oxidizable thermoelectric element from atmosphere containing oxygen, and especially at the elevated temperatures of operation of the thermoelectric generator at which severe oxidization would otherwise occur. The outer end of passageway 47 is closed by a plug 48, and a bore 49 is formed in body member to provide for convenient mounting of the assembly for use. Since the device has connection to a source of supply of gas under pressure, all leakage will be to the outside in view of which it is not essential that seals, such as provided at 23 and 38, be gas tight since nominal leakage therethrough may be tolerated.

Figures 3, 4, 5, 6, 7:
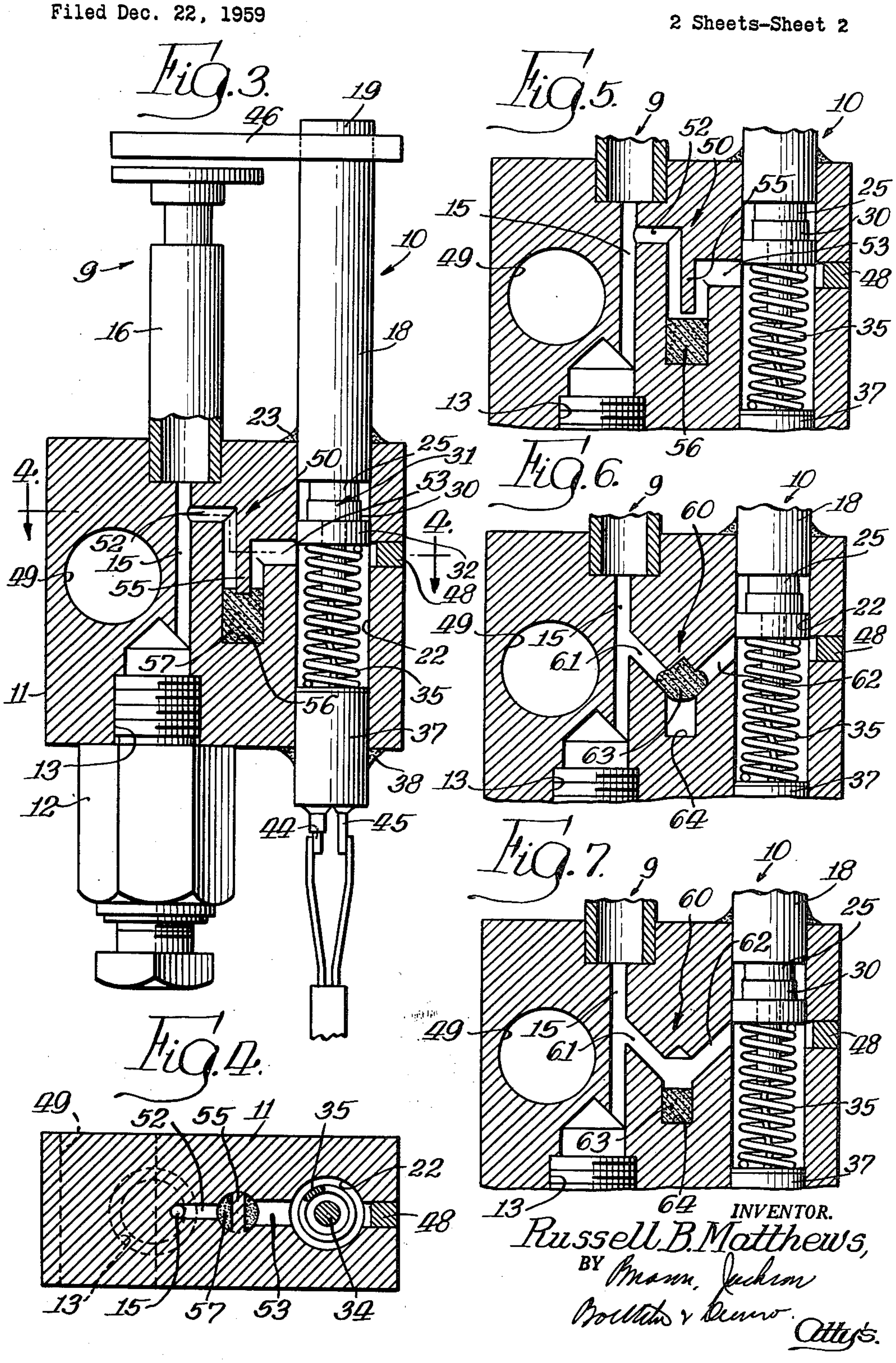
FIGURE 3 is a vertical sectional view of another embodiment of my invention embodying flow interrupter or valve means in interrupting or closed position, and with certain parts being shown in elevation.
FIGURE 4 is a detail horizontal sectional view taken along the line 4—4 on FIGURE 3 and looking in the direction indicated by the arrows.
FIGURE 5 is a vertical sectional view of a portion of the assembly shown in FIGURE 3 showing the flow interrupter or valve means in non-interrupting or open position.
FIGURE 6 is a vertical sectional view showing a portion of the assembly of another embodiment of my invention embodying another form of flow interrupter or valve means in interrupting or closed position.
FIGURE 7 is a view corresponding to FIGURE 6 but showing the flow interrupting or valve means in non-interrupting or open position.

Referring now to the embodiment of my invention shown in FIGURES 3 through 5 all parts bearing the above reference numerals are identical to those already described. The assembly shown in the last mentioned figure differs from the first described embodiment of my invention in the provision of a modified form of second passageway 50, in lieu of passageway 47, and in the provision of flow interrupter or valve means for connecting the first passageway means 15 with the bore 22 in which the thermoelectric generator 10 and other components are mounted as already described. In the form of invention under consideration, the second passageway 50 comprises a first leg or branch 52 and a second leg or branch 53 having connection, respectively, with first passageway 15 and bore 22 and between which a partition or wall 55 is disposed above a well 56 containing a body of fusible material 57 forming a flow interrupter or valve means in second passageway 50 between the first passageway 15 and bore 22.

The fusible material 57 is characterized by having a co-efficient of expansion such that it expands when it changes from liquid state to a solid state upon change from a predetermined high temperature (at which it is liquid) to a predetermined low temperature (at which it is solid). In the condition illustrated in FIGURE 3 of the drawings, it may be assumed that the flame at the burner 9 is extinguished and the temperature of the device as a whole has dropped accordingly to a predetermined low or room temperature. At such temperature the fusible material 57 assumes a solid state and expands contacting the partition wall 55 and interrupting or preventing passage of gas through second passageway 50 to bore 22. Upon ignition of gas issuing from burner 9, the assembly will reach a predetermined high temperature at which the fusible material 57 changes from solid to liquid state and diminishes in volume, as shown in FIGURE 5, and assumes a level out of contact with the bottom end of partition wall 55 so that gas under pressure from the source of supply flows through second passageway 50 and maintains a portion of the combustible gas under pressure within bore 22 to surround thermoelectric element 25 as aforedescribed. In the embodiment of FIGURES 3 through 5, the assembly when initially constructed, may be changed with a non-oxidizing gas in bore 22 for purposes indicated, and after assembly of the device in a gas line and operation of it, the bore 22 will have communication with the source of supply of non-oxidizing gas being burned at the burner. Should the burner become extinguished, the circuit interrupting means afore described will be effective to trap the non-oxidizing fuel gas in the bore 22 so the oxidizable thermoelectric element 25 of the generator is protected from oxygen at all times.

Figure 2:
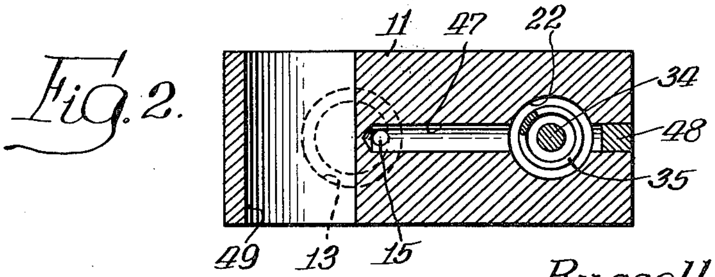
FIGURE 2 is a detail horizontal sectional view taken along the line 2—2 on FIGURE 1 and looking in the direction indicated by the arrows.

In the embodiment of the invention shown in FIGURES 6 and 7, the same reference numerals are applied to the same parts described in connection with FIGURES 1 and 2. In the assembly presently under consideration the second passageway means 60 comprises a first branch 61 connecting with first passageway 15, and a second branch 62 opening into the bore 22. At the point of juncture of branches 61 and 62, flow interrupter or valve means comprising a plug of fusible material 63 is disposed to contact flow of gaseous fuel through the passageway 60. A well 64 is disposed immediately below the intersection of branches 61 and 62 to receive the fusible plug 63 when changed from solid state to liquid state. In this form of the invention the bore 22 in construction of the device is preferably provided with a non-oxidizing atmosphere under pressure so as to protect the oxidizable inner thermoelectric element 25. Upon installation of the device in a gas line, and ignition of the gas issuing from the burner, the temperature of the assembly reaches a point at which the plug 63 changes from solid to liquid state with the liquid dropping into well 64 to connect branches 61 and 62. The first passageway means 15 is thus connected with the bore 22 to provide an atmosphere of gas from the source of supply of gas under pressure to bore 22 for protecting the inner oxidizable thermoelectric element 25.

The aforementioned fusible plugs 57 and 63 may be composed of materials having characteristics as aforeindicated, an example of such material being the well known type metal.

While I have shown and described what I consider to be certain preferred embodiments of my invention, it will be understood that various modifications and rearrangements may be made therein without departing from the spirit and scope of my invention.

I claim:

1. For use in an assembly of a fluid burner having connection with a source of supply of non-oxidizing combustible fluid under pressure, the combination of thermoelectric means comprising an oxidizable inner thermoelectric element, an outer thermoelectric element enclosing said inner thermoelectric element, and hot junction means between said inner and outer thermoelectric elements enclosed within said outer thermoelectric element, and means for surrounding said inner thermoelectric element with non-oxidizing combustible fluid from said source of supply to protect said inner thermoelectric element and said hot junction means from ambient atmosphere.

2. For use in an assembly of a gas burner having connection with a source of supply of non-oxidizing combustible gas under pressure, the combination of thermoelectric means comprising an oxidizable inner thermoelectric element, an outer thermoelectric element enclosing said inner thermoelectric element, and hot junction means between said inner and outer thermoelectric elemets enclosed within said outer thermoelectric element, and means for mounting said burner and said thermoelectric means in juxtaposed relation for heating of said hot junction means by said burner, and means for surrounding said oxidizable inner thermoelectric element with non-oxidizable gas from said source of supply to protect said oxidizable thermoelectric element and said hot junctions means from ambient atmosphere.

3. An assembly of the class described comprising, a gas burner, a thermoelectric generator comprising an outer metallic tubular metallic member having a closed end, an inner oxidizable thermoelectric element within said outer tubular member, and hot junction means between said closed end of said outer tubular member and said inner oxidizable thermoelectric element enclosed within said outer tubular metallic member means for mounting said gas burner and said thermoelectric generator in juxtaposed relation, and said means including passageway means for connecting said burner and said outer tubular member with a source of supply of non-oxidizing gas under pressure to provide for burning of gas from said source of supply by said burner, and to surround said oxidizable thermoelectric element with gas from said source of supply to protect said oxidizable thermoelectric element and said hot junction means from ambient atmosphere.

4. In combination, a gas burner, a thermoelectric generator comprising an outer metallic member closed at one end and opened at its other end, a body member for supporting said gas burner, an opening in said body member into which the open end portion of said outer metallic member extends for supporting the latter in juxtaposition to said burner, an oxidizable semi-metallic thermoelectric element disposed within said outer metallic member, hot junction means within and at the closed end of said outer metallic member and the adjacent end of said oxidizable semi-metallic thermoelectric element adapted to be heated by said burner, first passageway means in said body member for connecting said burner with a source of supply of gas under pressure, and second passageway means in said body member connecting said first passageway means with said opening to provide for admission of gas from said source of supply into said outer metallic member to surround said oxidizable semi-metallic thermoelectric element and protect the same and said hot junction means against ambient atmosphere.

5. In combination, a gas burner, a thermoelectric generator comprising an outer metallic housing closed at one end and opened at its other end, a body member for supporting said gas burner, an opening in said body member into one end of which the open end portion of said outer metallic housing extends for supporting the latter in juxtaposition to said burner, an oxidizable semi-metallic thermoelectric element disposed within said metallic housing, hot junction means within and at the closed end of said outer metallic housing and the adjacent end of said oxidizable semi-metallic thermoelectric element adapted to be heated by said burner, electrical lead means extending from the other end of said oxidizable semi-metallic thermoelectric element and outwardly of the other end of said opening in said body member, first passageway means in said body member for connecting said burner with a source of supply of gas under pressure, and second passageway means in said body member connecting said first passageway means with said opening to provide for admission of gas from said source of supply into said outer metallic housing to surround said oxidizable semi-metallic thermoelectric element and said hot junction means to protect the same against ambient atmosphere.

6. In combination, a gas burner, a thermoelectric generator comprising an outer metallic housing closed at one end and opened at its other end, a body member for supporting said gas burner, an opening in said body member into one end of which the open end portion of said outer metallic housing extends for supporting the latter in juxtaposition to said burner, an oxidizable semi-metallic thermoelectric element disposed within said metallic housing, hot junction means within and at the closed end of said outer metallic housing and the adjacent end of said oxidizable semi-metallic thermoelectric element adapted to be heated by said burner, electrical lead means extending from the other end of said oxidizable semi-metallic thermoelectric element and outwardly of the other end of said opening in said body member, sealing means at the opposite ends of said opening in said body member, first passageway means in said body member for connecting said burner with a source of supply of gas under pressure, and second passageway means in said body member connecting said first passageway means with said opening to provide for admission of gas from said source of supply into said outer metallic housing to sur round said oxidizable semi-metallic thermoelectric element and said hot junction means to protect the same against ambient atmosphere.

7. In combination, a gas burner, a thermoelectric generator comprising an outer housing closed at one end and open at its other end, a body member for supporting said gas burner, an opening in said body member into which the open end portion of said outer housing extends for supporting the latter in juxtaposition to said burner, an oxidizable semi-metallic thermoelectric element disposed within said outer housing, hot junction means within and at the closed end of said housing and the adjacent end of said oxidizable semi-metallic thermoelectric element adapted to be heated by said burner, first passageway means in said body member for connecting said burner with a source of gas under pressure, second passageway means in said body member connecting said first passageway means with said opening to provide for admission of gas into said outer tubular member to surround said oxidizable semi-metallic thermoelectric element and said hot junction means to protect the same against ambient atmosphere externally of said body member, and flow interrupting means in said second passageway means adapted at predetermined temperatures thereof to open and close, respectively, said second passageway means.

8. In combination, a gas burner, a thermoelectric generator comprising an outer housing closed at one end and open at its other end, a body member for supporting said gas burner, an opening in said body member into which the open end portion of said outer housing extends for supporting the latter in juxtaposition to said burner, an oxidizable semi-metallic thermoelectric element disposed within said outer housing, hot junction means within and at the closed end of said housing and the adjacent end of said oxidizable semi-metallic thermoelectric element adapted to be heated by said burner, first passageway means in said body member for connecting said burner with a source of gas under pressure, second passageway means in said body member connecting said first passageway means with said opening to provide for admission of gas into said outer tubular member to surround said oxidizable semi-metallic thermoelectric element and said hot junction means to protect the same against ambient atmosphere externally of said body member, and flow interrupter means in said second passageway means comprising fusible material having a coefficient of expansion affording expansion of the same in changing from liquid state to solid state upon change from a predetermined high temperature to a predetermined low temperature to open and close, respectively, said passageway means.

9. In combination, a gas burner, a thermoelectric generator comprising an outer housing closed at one end and open at its other end, a body member for supporting said gas burner, an opening in said body member into which the open end portion of said outer housing extends for supporting the latter in juxtaposition to said burner, an oxidizable semi-metallic thermoelectric element disposed within said outer housing, hot junction means within and at the closed end of said housing and the adjacent end of said oxidizable semi-metallic thermoelectric element adapted to be heated by said burner, first passageway means in said body member for connecting said burner with a source of gas under pressure, second passageway means in said body member connecting said first passageway means with said opening to provide for admission of gas into said outer tubular member to surround said oxidizable semi-metallic thermoelectric element and said hot junction means to protect the same against ambient atmosphere externally of said body member, flow interrupter means in said second passageway means comprising a plug of fusible material normally closing said second passageway means, said fusible material being adapted to be changed from solid state to liquid state at a predetermined temperature, and a reservoir for receiving said fusible material in its liquid state to effect opening of said second passageway means.

10. In combination, a gas burner, a thermoelectric generator comprising an outer metallic member closed at one end and opened at its other end, a body member for supporting said gas burner, an opening in said body member into which the open end portion of said outer metallic member extends for supporting the latter in juxtaposition to said burner, an oxidizable semi-metallic thermolectric element disposed within said outer metallic member, hot junction means within and at the closed end of said outer metallic member and the adjacent end of said oxidizable semi-metallic thermoelectric element adapted to be heated by said burner, first passageway means in said body member for connecting said burner with a source of supply of gas under pressure, second passageway means in said body member connecting said first passageway means with said opening to provide for admission of gas from said source of supply into said outer metallic member to surround said oxidizable semi-metallic thermoelectric element and said hot junction means to protect the same against ambient atmosphere, and fusible flow interrupter means closing said second passageway means trapping a non-oxidizing medium in said opening of said body member.

References Cited in the file of this patent

UNITED STATES PATENTS

| | | |
|---|---|---|
| 2,097,838 | Karrer | Nov. 2, 1937 |
| 2,303,183 | Wasson | Nov. 24, 1942 |
| 2,340,899 | Ray | Feb. 8, 1944 |